(12) United States Patent
Dor et al.

(10) Patent No.: US 9,570,174 B2
(45) Date of Patent: Feb. 14, 2017

(54) CODING METHOD AND DECODING METHOD IN MEMORY SYSTEM

(71) Applicant: SAMSUNG ELECTRONICS CO., LTD., Suwon-Si, Gyeonggi-Do (KR)

(72) Inventors: Avner Dor, Kfar Saba (IL); Moshe Twitto, Shemuel (IL); Jun-Jin Kong, Yongin-Si (KR); Hong-Rak Son, Anyang-Si (KR); Young-Geon Yoo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 79 days.

(21) Appl. No.: 14/446,350

(22) Filed: Jul. 30, 2014

(65) Prior Publication Data

US 2015/0103596 A1 Apr. 16, 2015

(30) Foreign Application Priority Data

Oct. 14, 2013 (KR) ........................ 10-2013-0122184

(51) Int. Cl.
| | |
|---|---|
| G06F 11/10 | (2006.01) |
| G11C 16/10 | (2006.01) |
| G11C 16/08 | (2006.01) |
| G11C 11/56 | (2006.01) |
| G11C 16/04 | (2006.01) |

(52) U.S. Cl.
CPC ........... *G11C 16/10* (2013.01); *G06F 11/1048* (2013.01); *G11C 11/5628* (2013.01); *G11C 16/0483* (2013.01); *G11C 16/08* (2013.01)

(58) Field of Classification Search
CPC .................................................. G06F 11/1008
USPC ................... 714/763, 768, 755, 758, 770
See application file for complete search history.

(56) References Cited

U.S. PATENT DOCUMENTS

| | | | |
|---|---|---|---|
| 7,818,653 B2 | 10/2010 | Brandman et al. | |
| 7,840,875 B2 | 11/2010 | Conley | |
| 8,976,474 B1 * | 3/2015 | Wang | G11B 20/1426 341/50 |
| 8,996,969 B2 * | 3/2015 | Bolotov | H03M 13/1111 714/752 |
| 9,009,569 B2 * | 4/2015 | Taranta, II | G06F 11/1076 714/768 |
| 2008/0266946 A1 | 10/2008 | Magnavacca et al. | |
| 2010/0020620 A1 | 1/2010 | Kim et al. | |
| 2010/0077279 A1 * | 3/2010 | Kim | G06F 11/1068 714/755 |
| 2010/0153818 A1 | 6/2010 | Bueb | |
| 2010/0318877 A1 | 12/2010 | Amato et al. | |
| 2011/0090734 A1 | 4/2011 | Burger, Jr. et al. | |
| 2013/0117620 A1 * | 5/2013 | Joo | G11C 16/10 714/746 |

* cited by examiner

*Primary Examiner* — Fritz Alphonse
(74) *Attorney, Agent, or Firm* — Volentine & Whitt, PLLC

(57) ABSTRACT

Provided are a coding/decoding method for use in a multi-level memory system. The coding method includes searching for a set of symbols that may generate a forbidden pattern that is set initially from an input data stream, and sticking at least one bit included in the searched set of the symbols that may generate the forbidden pattern so as not to generate the forbidden pattern.

18 Claims, 13 Drawing Sheets

FIG. 17

| P1 | E  | P1 | E  | P3 | P3 | P1 |
|----|----|----|----|----|----|----|
| P2 | E  | P3 | E  | P3 | E  | P2 |
| P2 | P1 | E  | P3 | P2 | P3 | E  |

FIG. 18

| P1 | E  | P1 | E  | P3 | P3 | P1 |
|----|----|----|----|----|----|----|
| P2 | E  | P3 | E  | P3 | E  | P2 |
| P2 | P1 | E  | P3 | P2 | P3 | E  |

| P1 | E  | P1 | E  | P3 | P3 | P1 |
|----|----|----|----|----|----|----|
| P2 | E  | P3 | E  | P3 | E  | P2 |
| P2 | P1 | E  | P3 | P2 | P3 | E  |

CODING METHOD AND DECODING METHOD IN MEMORY SYSTEM

CROSS-REFERENCE TO RELATED APPLICATIONS

This application claims the benefit of Korean Patent Application No. 10-2013-0122184 filed on Oct. 14, 2013, the subject matter of which is hereby incorporated by reference.

BACKGROUND

The inventive concept relates to coding/decoding methods that may be used to avoid errors in data stored by semiconductor memory devices. More particularly, the inventive concept relates to coding/decoding methods that may be used in a restricted multi-level memory system.

The available memory space provided by a semiconductor memory device may be logically divided into a number of blocks. Each block includes a plurality of constituent word lines, and each word line is operatively coupled to a set of memory cells. Memory cells in many contemporary semiconductor memory devices may be configured to operate as single-level memory cells (SLC) capable of storing binary data, or as multi-level memory cells (MLC) capable of storing multi-level data (i.e., two or more data bits per memory cell). As one might expect, the complexity involved in storing multi-level data in an array of MLC is considerable. As has been widely appreciated, the overall "data pattern" with which data becomes stored across an array of memory cells may influence a memory system's ability to accurately read and provide the stored data during a subsequently performed read operation. That is, certain data patterns may be errantly read due to certain coupling effect between vertically and horizontally adjacent (or proximate) memory cells in an array of memory cells. Accordingly, data coding/decoding techniques may be needed to avoid the possibility of problematic data patterns causing errors during read operations.

SUMMARY

The inventive concept provides a coding method for a memory system including a memory cell array, the method including; searching for a set of symbols that generate a forbidden pattern in input data received by the memory system, and sticking at least one bit in the searched set of the symbols to avoid generation of the forbidden pattern.

The inventive concept also provides a decoding method for a memory system, including; obtaining read data from a memory device in response to a read request, and performing a decoding process using location information identifying a stuck bit included in the read data during an encoding process.

BRIEF DESCRIPTION OF THE DRAWINGS

Embodiments of the inventive concept will be more clearly understood from the following detailed description taken in conjunction with the accompanying drawings in which:

FIG. 17 is a data table illustrating one example of a forbidden data pattern generated in a horizontal direction of a memory cell array;

FIG. 18 is a data table illustrating another example of a forbidden data pattern generated in a vertical direction of a memory cell array;

DETAILED DESCRIPTION

Hereinafter, embodiments of the inventive concept will be described in some additional detail with reference to the accompanying drawings. The inventive concept may, however, be embodied in many different forms and should not be construed as being limited to only the illustrated embodiments. Rather, these embodiments are provided so that this disclosure will be thorough and complete and will fully convey the scope of the inventive concept to those skilled in the art. The scope of the inventive concept allows for various changes and modifications to the illustrated embodiments as well as many other similar embodiments. Throughout the written description and drawings, like reference numbers and labels are used to denote like or similar features.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items. Expressions such as "at least one" when preceding a list of elements, modify the entire list of elements and do not modify the individual elements of the list.

Figure 1:
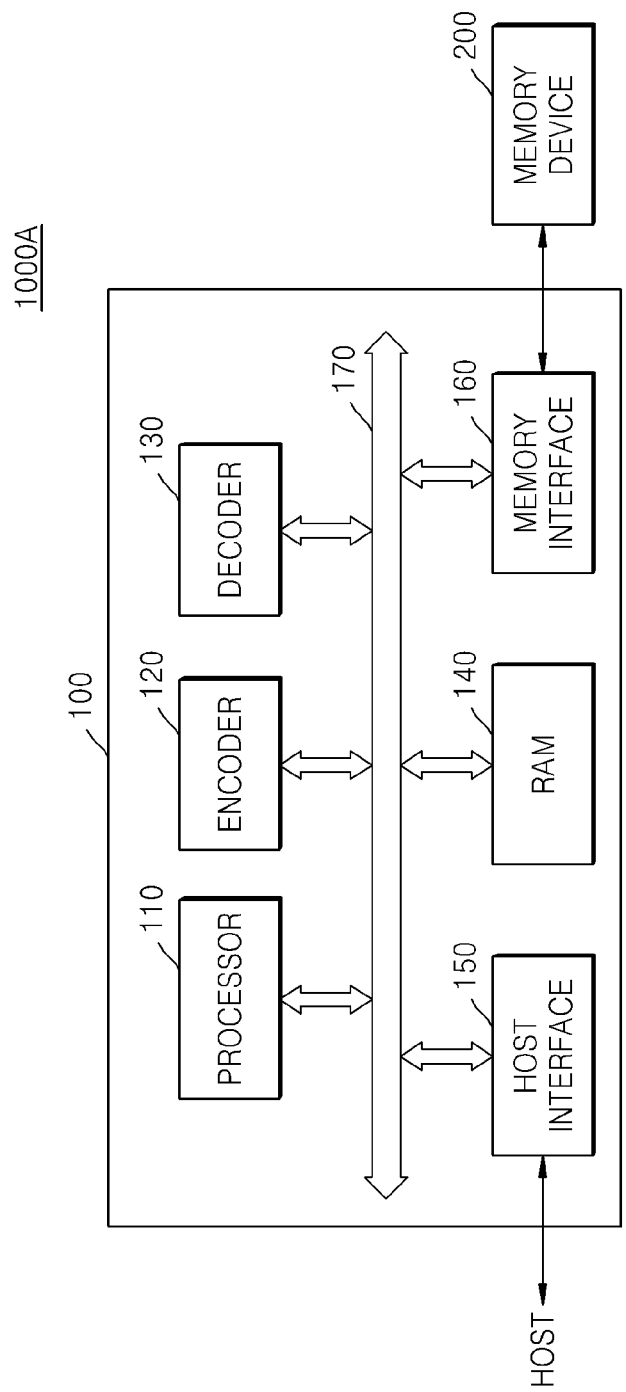
FIG. 1 is a block diagram of a memory system according to an embodiment of the inventive concept.

Figure (FIG. 1 is a block diagram of a memory system 1000A according to an embodiment of the inventive concept. The memory system 1000A generally comprises a memory controller 100 and a memory device 200.

The memory device 200 may be a non-volatile memory device. For example, the memory device 200 may be a flash memory device, a phase change random access memory (PRAM), a ferroelectric RAM (FRAM), or a magnetic RAM (MRAM) device. The memory device 200 may be configured to include at least one non-volatile memory device and at least one volatile memory device, or two or more kinds of non-volatile memory devices. In certain embodiments of the inventive concept, the memory device 200 may be configured as a single flash memory chip, or as multiple flash memory chips.

The memory controller 100 illustrated in relevant part in FIG. 1 comprises a processor 110, an encoder 120, a decoder 130, a RAM 140, a host interface 150, a memory interface 160, and a bus 170.

The processor 110 is electrically connected to the encoder 120, the decoder 130, the RAM 140, the host interface 150, and the memory interface 160 via the bus 170.

The bus 170 generally denotes one or more transfer path(s) through which data, addresses and/or control information may be transferred between the various components of the memory controller 100.

The processor 110 controls the overall operation of the memory system 1000A. In particular, the processor 110 interprets various commands or instructions communicated from a host, and in response controls the operation of the memory system 1000A. For example, the processor 110 provides the memory device 200 with a read command and an address during a read operation, and provides the memory device 200 with a write command, an address, and an encoded codeword during a write operation.

The processor 110 may also be used to convert a logical address received from the host into a corresponding physical page address associated with the memory device 200 using metadata stored in the RAM 140.

The RAM 140 may also be used to temporarily store data received from the host, data generated by the processor 110, data read from the memory device 200, and/or metadata read from the memory device 200.

Consistent with certain embodiments of the inventive concept, the RAM 140 may also be used to store information identifying forbidden data pattern(s) that may possibly arise during the operation of the memory device 200, as well as stuck bit(s) information. These features will be described in greater detail hereafter.

The RAM 140 may be implemented from one or more volatile memory devices such as a DRAM or SRAM.

"Metadata" is information generated by the memory system 1000A that is used to manage the operation of the memory device 200. For example, metadata may include management information such as mapping table(s) that are used to convert logical addresses received from the host into corresponding physical page addresses for the memory device 200. Such mapping tables may include the mapping table information necessary to perform address mapping on a page unit basis. Additionally, metadata may include information that is used to manage (e.g., allocate/de-allocate) the memory space made available by the memory cell array(s) of the memory device 200.

The host interface 150 includes a protocol for data exchange with a host connected to the memory device 200, and connects the memory device 200 and the host to each other. The host interface 150 may be realized as an advanced technology attachment (ATA) interface, a serial advanced technology attachment (SATA) interface, a parallel ATA (PATA) interface, a universal serial bus (USB) interface or a serial attached small (SAS) computer system interface, a small computer system interface (SCSI), embedded multi media card (eMMC) interface, or a UNIX file system (UFS) interface. However, the inventive concept is not limited to the enumerated examples above. In particular, the host interface 150 may exchange commands, addresses, and data with the host according to control of the processor 110.

The memory interface 160 is electrically connected to the memory device 200. The memory interface 160 may support the interface with a NAND flash memory chip or a NOR flash memory chip. The memory interface 160 may be configured so that software and hardware interleaved operations may be selectively performed via a plurality of channels.

The processor 110 controls the memory system 1000A to read metadata stored in the memory device 200, and/or to store metadata back to the RAM 140 when the memory system 1000A powered ON. The processor 110 controls the memory system 1000A to update the metadata stored in the RAM 140 according to a metadata update operation performed by the memory device 200 under the control of processor 110. In addition, the processor 110 controls the memory system 1000A to write metadata stored in the RAM 140 to the memory device 200 before the memory system 1000A is powered OFF.

Further, the processor 110 controls the memory controller 100 to perform an encoding process on information words transmitted from the host to the encoder 120 during a write operation. Analogously the processor 110 controls the memory controller 100 to perform a decoding process on data read from the memory device 200 and transmitted to the decoder 130 during the a read operation.

In certain embodiments, the encoder 120 may be used to generate a codeword by adding parity bits represented by an LDPC code to an information word received from the host. As an example, parity bits related to information words may be generated using certain conventionally understood algorithms, such as Reed-Solomon (RS) code, Hamming code, Cyclic Redundancy C (CRC) code, etc.

As a result of any one of these particular encoding processes, a set of symbols that has been formulated as indicating the presence of a "forbidden data pattern" may be searched in relation to the generated codeword(s). Upon identifying one or more symbols indicating a forbidden data pattern, at least one bit included in the searched set of the symbols is processed as a "stuck bit" such that the forbidden data pattern is not, in fact, generated. Accordingly, a "defined set of symbols" that are likely to generate at least one forbidden data pattern may be changed into a corresponding "changed set of symbols" that are unlikely to generate a forbidden pattern using one or more stuck bit process(es).

For example, the encoder 120 of FIG. 1 may perform an encoding operation with constraints placed upon at least one stuck bit (i.e., at least one bit that has been "stuck" into a stream of data as received from the host to thereby avoid the generation of a forbidden data pattern). Thereafter, the decoder 130 may perform a corresponding decoding operation understanding the constraints previously placed upon the at least one stuck bit in order to recover the stuck bit from the stored encoded information (i.e., to identify and remove the at least one stuck bit to thereby restore the original data received from the host).

In one further example, the encoder 120 may generate location information identifying the location of a bit that will be processed as a stuck bit. Such "stuck bit location information" may be written in an overhead data region for a corresponding page.

Continuing with the working example, the decoder 130 may be used to perform a LDPC decoding process on data read from the memory device 200 on a codeword unit basis in order to recover the information word. As an example, the bit processed as the stuck bit during encoding may be restored to its original value using corresponding location information. Afterwards, an error detection and/or correction operation may be performed with respect to the code word that has been restored by decoding and re-adjustment of the stuck bit using (e.g.,) one or more a parity bit(s).

Figure 2:
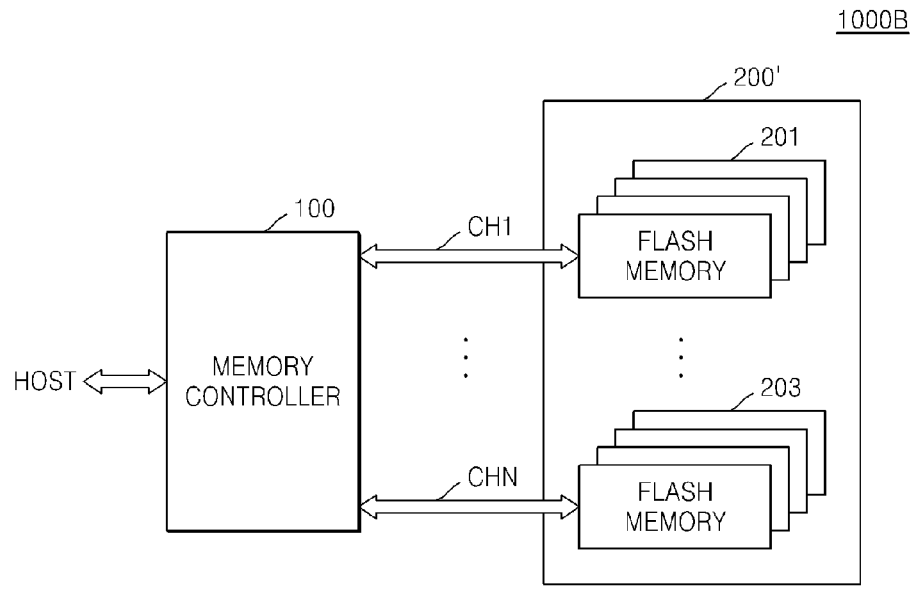
FIG. 2 is a block diagram of a memory system including a plurality of channels according to another embodiment of the inventive concept.

FIG. 2 is a block diagram further illustrating a memory system 1000B including a memory device 200' that operates in relation to a plurality of channels and ways. In this regard, the memory system 1000B may be configured as a solid state drive, or solid state disc (SSD).

The memory device 200' of the memory system 1000B includes respective pluralities of flash memory chips 201 . . . 203, connected to the memory controller 100 via first through Nth. For example, each channels may be used to connect four (4) flash memory chips, but this is just one possible arrangement as will be appreciated by those skilled in the art.

Figure 3:
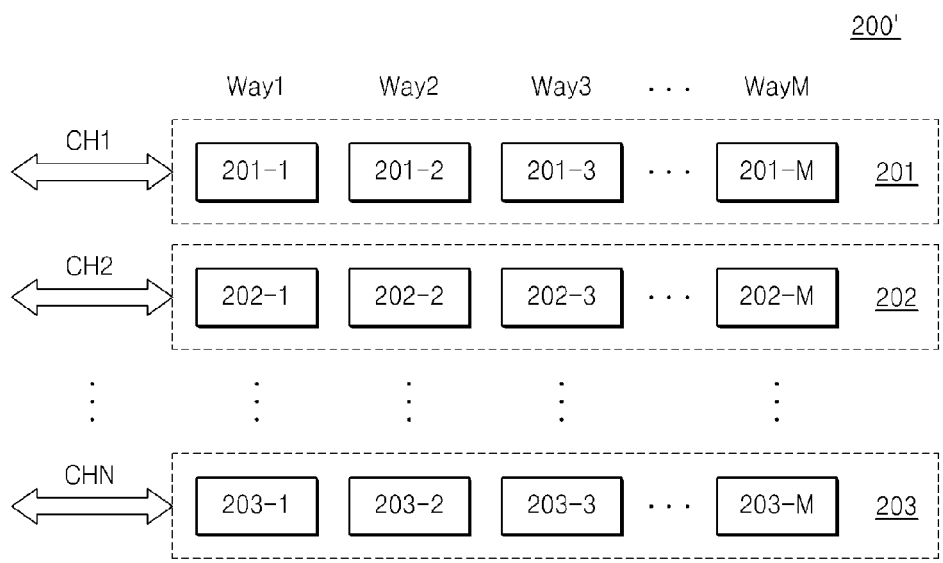
FIG. 3 is a diagram further illustrating channels and banks in the memory systems of FIGS. 1 and 2.

FIG. 3 is a diagram further illustrating one possible structure for the channels and ways of the memory system 1000B of FIG. 2.

A pluralities of flash memory chips 201 . . . 203 are electrically connected to one of the plurality of channels CH1 through CHN. Each of the channels CH1 through CHN denotes an independent bus that may be used to transmit/receive commands, addresses, and data to/from the corresponding flash chips. The flash memory chips connected to different channels may be independently operated. The pluralities of flash memory chips 201 . . . 203 connected to the channels CH1 through CHN form a plurality of vertically aligned ways (e.g., way1 through wayM), as compared with the plurality of horizontally aligned channels. A number of M flash memory chips may be connected across the M ways with respect to each of the channels CH1 through CHN.

For example, flash memory chips 201 may configure M ways across a first channel CH1. Hence, in one nomenclature, flash memory chips 201-1 through 201-M may be respectively connected in M ways across the first channel CH1. Such relationships between flash memory chips, ways, and channels may be variously determined according to needs of the memory system.

Consistent with the foregoing, a "way" designation is one manner in which a particular flash memory chip may be distinguished in its channel. Thus, each flash memory chip may be identified according to its channel and way numbers, and it may be readily determined which flash memory chip performs a request operation requested by the host in relation to a particular logical address.

Figure 4:
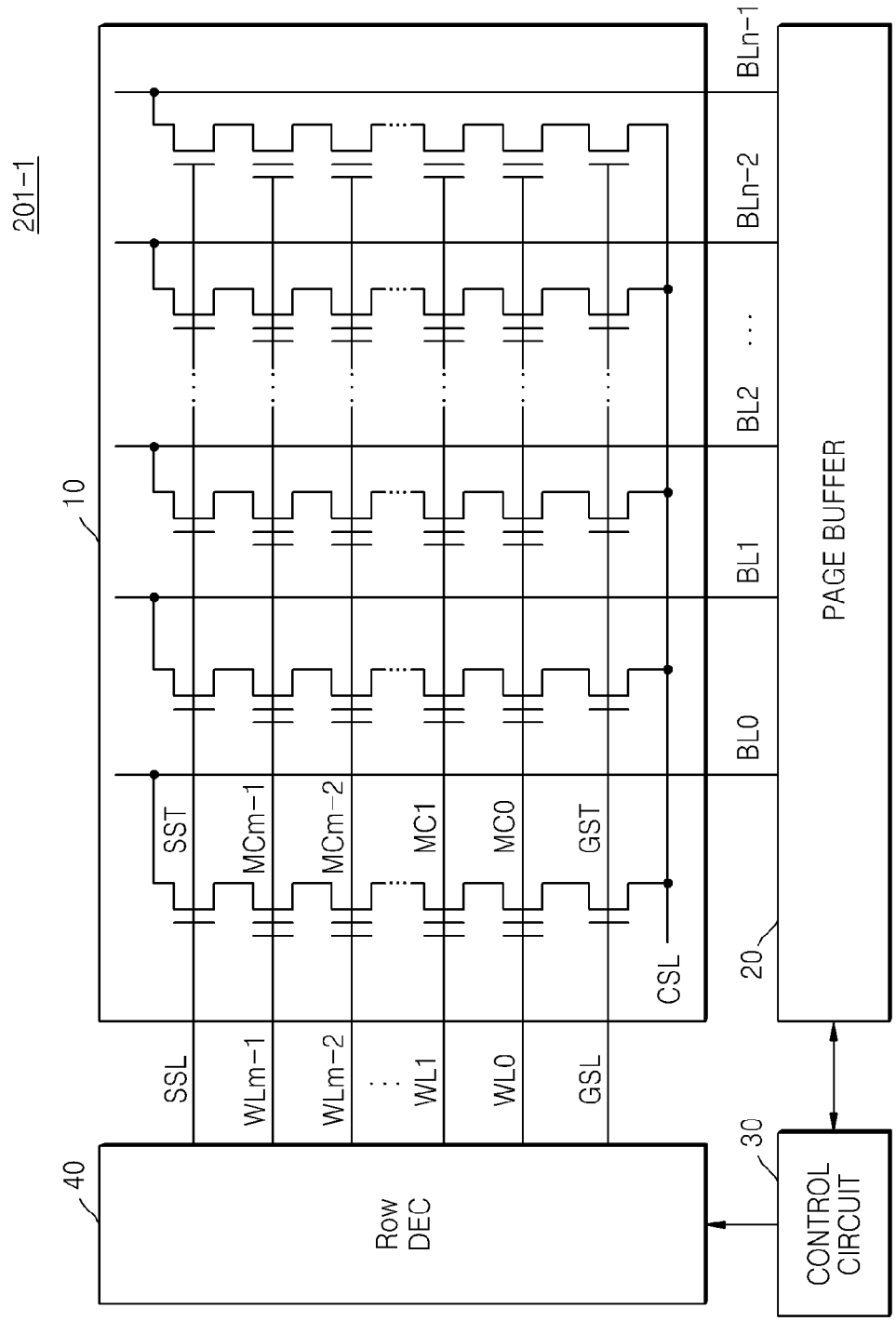
FIG. 4 is a block diagram further illustrating one possible configuration for a flash memory chip that may be included in the memory systems of FIGS. 1 and 2.

FIG. 4 is a block diagram further illustrating in one example a flash memory chip (e.g.,) 201-1 that may be used in the memory device 200' of FIG. 3. Here, the flash memory chip 201-1 generally comprises a cell array 10, a page buffer 20, a control circuit 30, and a row decoder 40.

The cell array 10 is an area in which data is written by applying a predetermined voltage to a transistor. The cell array 10 includes memory cells formed on points where word lines WL0 through WLm−1 and bit lines BL0 through BLn−1 cross each other. Here, m and n are natural numbers. In FIG. 4, only one memory block is shown; however, the cell array 10 may include a plurality of memory blocks. Each of the memory blocks includes a page corresponding to each of the word lines WL0 through WLm−1. In addition, each page may include a plurality of memory cells connected to the corresponding word line. The flash memory chip 201-1 performs an erasing operation with respect to each memory block, and performs a programming operation or a read operation with respect to each page.

The memory cell array 10 has a cell string structure. Each of cell strings includes a string selection transistor (SST) connected to a string selection line (SSL), a plurality of memory cells MC0 through MCm−1 respectively connected to the plurality of word lines WL0 through WLm−1, and a ground selection transistor (GST) connected to a ground selection line (GSL). Here, the SST is connected between the bit line and a string channel, and the GST is connected between the string channel and a common source line (CSL).

The page buffer 20 is connected to the cell array 10 via the plurality of bit lines BL0 through BLn−1. The page buffer 20 temporarily stores data that will be written in the memory cells connected to the selected word line, or the data read from the memory cells connected to the selected word line.

The control circuit 30 generates various voltages necessary to perform the programming operation or the read operation, and the erasing operation, and controls overall operations of the flash memory chip 201-1.

The row decoder 40 is connected to the cell array 10 via the SSL, the GSL, and the plurality of word lines WL0 through WLm−1. The row decoder 40 receives an address during the programming operation or the read operation, and selects one of the word lines according to the input address. Here, the memory cells for performing the programming operation or the read operation are connected to the selected word line.

Also, the row decoder 40 applies voltages that are necessary for the programming operation or the read operation (for example, a programming voltage, a pass voltage, a reading voltage, a string selection voltage, and a ground selection voltage) to the selected word line, non-selected word lines, and the selection lines (SSL and GSL).

Each of the memory cells may store data of one bit or two or more bits. The memory cell storing the data of one bit may be referred to as a single level cell (SLC). In addition, the memory cell storing the data of two or more bits may be referred to as a multi level cell (MLC). The SLC is in an erase state or a program state according to a threshold voltage thereof.

Figure 5:
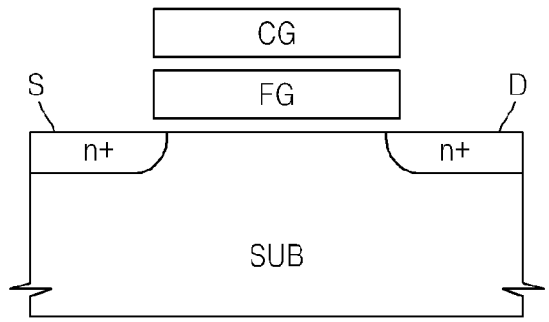
FIG. 5 is a cross-sectional view showing a memory cell that may be included in the memory cell array of FIG. 4.

FIG. 5 is a cross-sectional view showing an example of the memory cell that may be included in the memory cell array of FIG. 4.

Referring to FIG. 5, a source S and a drain D are formed in the substrate SUB to define a channel region between the source S and drain D. A floating gate FG is formed on an upper portion of the channel region, and an insulating layer such as a tunneling insulating layer may be disposed between the channel region and the floating gate FG. A control gate CG is formed on an upper portion of the floating gate FG, and an insulating layer such as a blocking insulating layer may be disposed between the floating gate FG and the control gate CG. In order to program about the memory cell, certain control voltages are selectively applied to cause execution of erase, read and/or program operation(s).

The data stored in the memory cell of FIG. 5 may be read by discriminating the level of a corresponding threshold voltage (Vth). Here, the threshold voltage Vth of the memory cell will be defined by a quantity of electrons stored on the floating gate FG. In particular, the more the electrons stored on the floating gate FG are, the higher the threshold voltage Vth of the memory cell.

Figure 6:
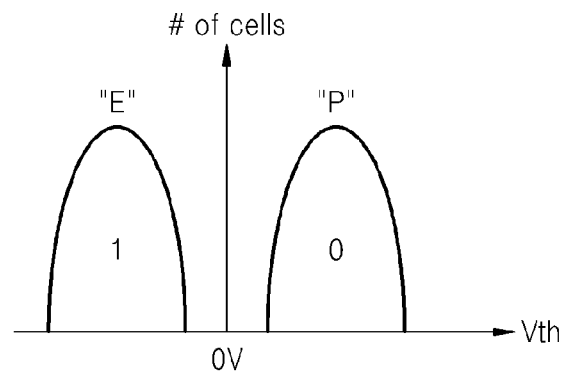
FIG. 6 is a diagram showing a distribution of threshold voltages for a SLC.

FIG. 6 is a diagram showing a distribution of threshold voltages Vth for a SLC having an erased state "E" corresponding to a data value of '1' and a programmed state "P" corresponding to a data value of '0'. Here, the erased and programmed states may be discriminated in relation to a threshold voltage level of 0V.

Figure 7:
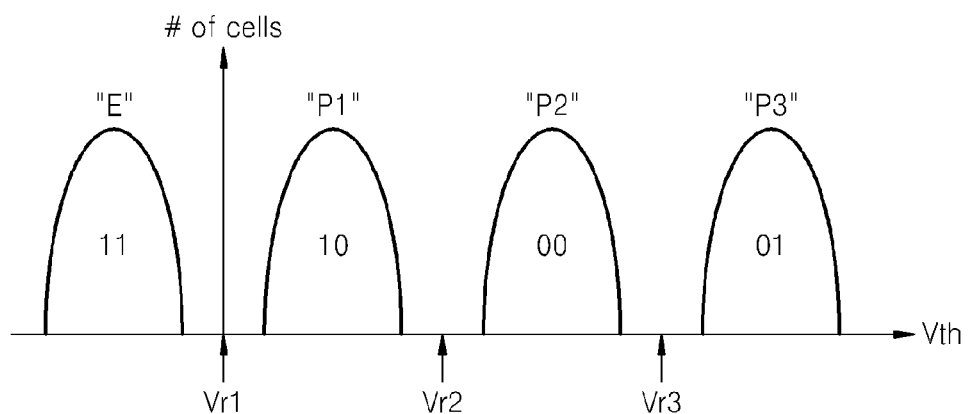
FIG. 7 is a diagram showing a distribution of threshold voltages for a 2-bit MLC.

FIG. 7 is a diagram showing distribution of the threshold voltages for a 2-bit MLC having an erased state "E", and respective first ("P1"), second ("P2"), and third ("P3") programmed states, respectively corresponding to data values of 11, 10, 00 and 01. Here, the successively higher threshold voltage distributions associated with the erased state and first, second and third programmed states may be variously discriminated using three (3) reference (of "read") voltages Vr1, Vr2 and Vr3.

Figure 8:
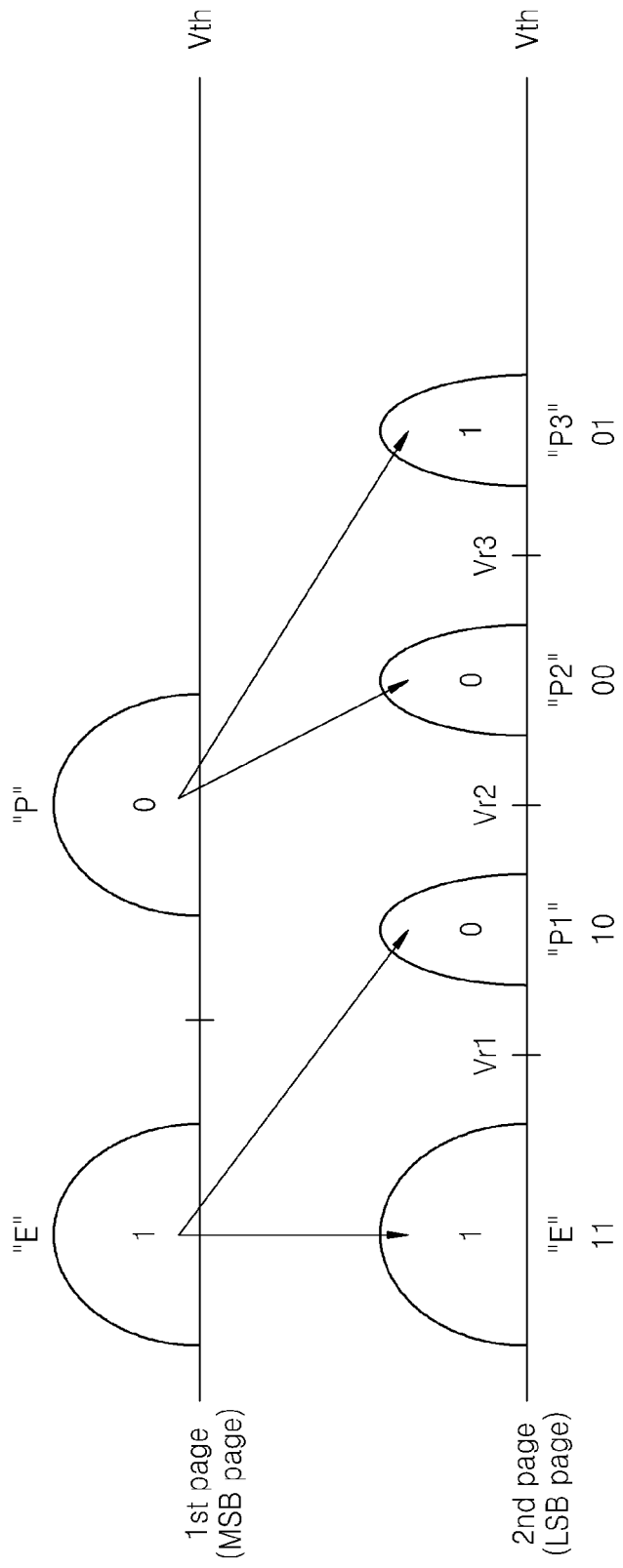
FIG. 8 is a conceptual diagram illustrating one possible approach to the programming of a 2-bit MLC.

FIG. 8 is a conceptual diagram illustrating one approach to the programming of the 2-bits MLC of FIG. 7.

The two (2) bits programmed in each 2-bit MLC may be referred to as a most significant bit (MSB) and a least significant bit (LSB). A page of MSB and a page of LSB may be programmed to a group of memory cells commonly connected to a word line and referred to as a physical page of memory cells. However, MSB and LSB data are separately programmed according to different MSB and LSB logical pages, per each physical page of memory cells using separate programming operations.

Referring to FIG. 8, a "first page" programming step programs the MSB data, and thereafter, a "second page" programming step programs the LSB data in a particular physical page of memory cells.

Before executing the foregoing programming operation, all the memory cells of a physical page to be programmed will be placed in the erased state E. Thus, when the first page programming is executed, the memory cells ultimately having a MSB value of '0' are placed in an intermediate program state "P", while memory cells ultimately having a MSB value of '1' remain in the erased state E.

After executing the first page programming step, the second page programming step may be performed. Here, the memory cells of the physical page being programmed are initially in the erased state E or the intermediate program state "P". When the second page programming is executed, memory cells having a LSB value of '1' either remain in the erased state "E", or are programmed from the intermediate program state "P" to the third program state "P3". Similarly, when the second page programming is executed, memory cells having a LSB value of '0' are either programmed from the erased state "E" to the first program state "P1", or are programmed from the intermediate program state "P" to the second program state "P2".

Thus, according to the data-value/threshold-voltage-distribution correlation shown in FIG. 8, memory cells having the erased state "E" are interpreted as a data value of "11", memory cells having the first programmed state P1 are interpreted as a data value of "10", memory cells having the second programmed state P2 are interpreted as a data value of "00", and memory cells having the third programmed state P3 are interpreted as a data value of "01".

Figure 9:
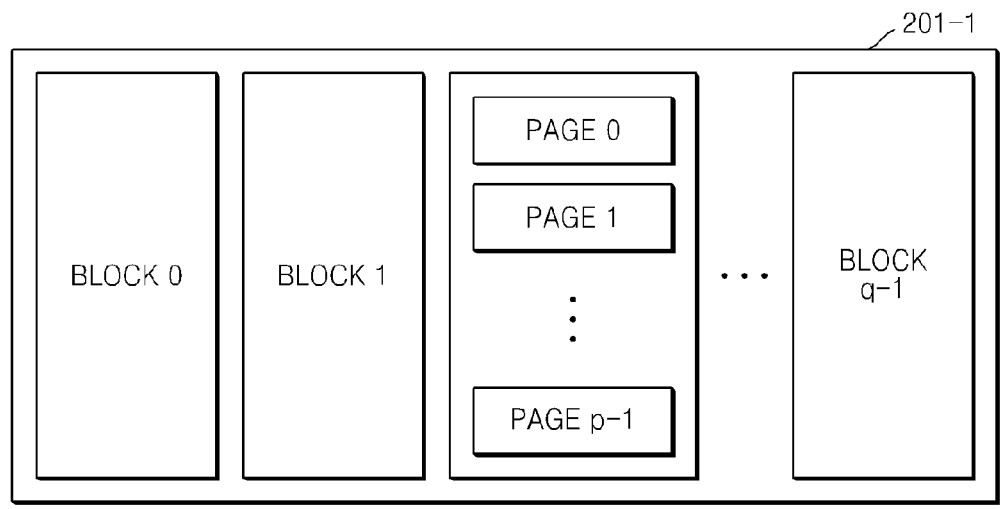
FIG. 9 is a block diagram illustrating one possible internal storage structure for a flash memory chip that may be incorporated within certain embodiments of the inventive concept.

FIG. 9 is a block diagram illustrating one possible internal storage structure for a flash memory chip that may be incorporated within certain embodiments of the inventive concept. As shown in FIG. 9, an internal structure of the flash memory chip 201-1 includes a plurality of blocks, where each block includes a plurality of pages.

In the flash memory chip 201-1, the reading/writing of data is performed on a page unit basis, while the erasing of data is performed on a block unit basis. As previously noted, an erase operation must be performed on a block before data can be written to memory cells of the block during a write operation. Accordingly, direct overwriting (without an intervening erase operation) is not possible.

In memory devices like the one illustrated in FIG. 9 that are not capable of direct overwriting, certain user data may not be written in a physical area of memory indicated by operation of the host. Therefore, when the host request to access during a read/write operation to certain physical areas of the memory, an address translation operation must be used to convert the logical addresses indicating the requested physical area per the write/read request data into corresponding physical page addresses actual associated with the physical location of the data in the memory device.

Exemplary processes for accomplishing logical/physical address translation for the memory systems 1000A and 1000B will be described with reference to FIG. 10.

Figure 10:
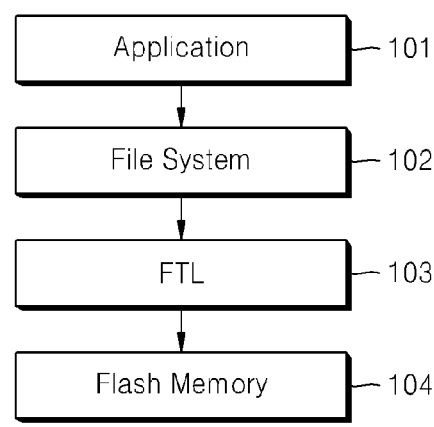
FIG. 10 is a conceptual diagram showing a hierarchy of software component that may be used in conjunction with the operation of the processor 110 of FIG. 1.

FIG. 10 is a block diagram illustrating a hierarchy of software components that may be used to control the operation of memory systems 1000A and 1000B. As an example, FIG. 10 shows one possible software configuration assuming the use of the memory device 200. Thus, the illustrated software hierarchical structure includes from highest level of abstraction to lowest; an application layer 101, a file system layer 102, a flash translation layer (FTL) 103, and a flash memory layer 104.

The application layer 101 denotes firmware processing data in response to the user input from the host. In the application layer 101, the user data is processed in response to the user input, and a command for storing the processed user data in a flash memory chip is transmitted to the file system layer 102.

In the file system layer 102, a logical address in which the user data will be stored is allocated in response to the command transmitted from the application layer 101. A file allocation table system or NTFS may be used as the file system in the file system layer 102.

In the FTL 103, the logical address transmitted from the file system layer 102 is converted to the physical page address for performing the writing/read operations in the flash memory chip. In the FTL 103, the logical address may be converted into the physical page address by using mapping information included in the metadata. The address conversion operation in the FTL 103 may be performed by the processor 110 of the memory controller 100.

In the flash memory layer 104, control signals for writing or reading data by accessing the physical page address converted from the logical address are generated.

Referring back to FIG. 4, due to coupling effects between adjacent memory cells in the cell array 10 certain data patterns may be deemed "forbidden" since they are likely to be incorrectly read. In a case assuming the use of a two-dimensional (2D) memory cell array, a memory cell may induce undesired coupling between both its horizontal and vertical neighbor cells. As an example, further assuming the use of 2-bit MLC, where a "horizontal" arrangement (i.e., one extending along a word line) of adjacent memory cells is programmed in a sequence of P3, then E, then P3 (hereafter, a "P3-E-P3" pattern), it is highly likely that errant read data will be retrieved during a subsequent read operation. In contrast, it is less likely that a "vertical" arrangement (i.e., one extending along a bit line) of adjacent memory cells being programming according to a P3-E-P3 pattern will result in read data errors. Thus, assuming the use of a 2D memory cell array, it is very possible that any memory cell having the erased state E and being adjacent to more than one memory cell programmed to the third program state P3 may be considered a potential problem in relation to coupling effects and resultant errant data.

Recognizing the foregoing, certain approaches to avoiding the operational issues arising from undesired stored data patterns make use of so-called "constrained coding" techniques. Unfortunately, such approaches making use of constrained coding suffer from several serious shortcomings. First, attempts to eliminate all occurrences of an undesired pattern comes at the cost of a reduced code rate. Second, at certain high code rates, the solutions offered by constrained coding theory (e.g., use of a state-splitting algorithm) are computationally costly, and sometimes, impractical. Third, conventional constrained coding requires the information regarding all of the pages of a word line (WL) to be decoded, otherwise a substantial rate penalty emerges.

Conventional coding for vertical constraints suffer from another major drawback. Namely, the required decoding reading must be made for several word lines. As random access requires reading of a single page at a time, reading of several word lines, each including several pages, incurs an intolerably long read time penalty.

Although discussing only 1D and 2D patterns, there are situations where the problem (constraints) arises in higher dimensions. One exemplary technology is the so-called vertical NAND. In this technology, several blocks are "vertically" stacked one on top of the other in order to reduce the amount of substrate real estate occupied by the memory cell array. The resulting three-dimensional (3D) memory cell array structure gives rise to 3D constraints.

Embodiments of the inventive concept provide methods of storing data in a storage device including a memory cell array having multidimensional constraints which eliminate the shortcomings noted above. That is, data patterns capable of causing errant read data due to coupling induction may be defined (or "set") as forbidden data patterns. Further, at least one "stuck bit" associated with each forbidden data pattern may be changed using a coding process in order to eliminate the forbidden data pattern from occurring.

Hence, in certain embodiments, the inventive concept provides a control approach that is parameterized by a list of forbidden data patterns, wherein the control approach performs at least two actions:

First encoding, such that the control approach accepts unconstrained input data and converts it using a page-by-page operation into constrained input data having:
(1) no occurrence of the undesired data pattern, and/or
(2) a controlled number of occurrences of the undesired data pattern parameterized by either; (a) an arbitrary percentage of occurrences from the total number of memory cells, or (b) a threshold-based priority mechanism deciding which occurrences of undesired data patterns are eliminated.

Second decoding, such that the control approach reads the constrained input data (e.g., when being read from memory) and recovers the original unconstrained input data using a page-by-page operation where a desired page is read and its corresponding information retrieved.

The encoding step above may further consist of segmentation of the unconstrained input data (e.g., multidimensional data) into a structure having blocks and being segmented according to a coding order. Here, the constraints are honored by using binary linear codes for stuck bits as constituent codes. This approach will be described in some additional detail hereafter.

In order to better describe the making and use of the subject inventive concept certain terms will be defined. An "elementary data unit" is the most primitive data unit within a data structure. For example, assuming the use of a NAND flash memory in certain embodiments of the inventive concept, an elementary data unit may be defined as a "symbol" (e.g., a N-bit digital data value, where 'N' is a natural number) stored by a single memory cell. Alternatively, an elementary data unit may be defined as a single bit stored in conjunction with a symbol defined in a higher alphabet.

The "dimensions" of an elementary data unit can be referenced (or indexed) by a vector of integers. Hence, each entry of the vector may be said to relate to a dimension.

Of further definitional note, a "constraint span" is defined as a number of elementary data units that are affected by a single constraint.

Again assuming the use of a NAND flash memory, a basic data unit may be defined as a symbol in the memory cell. A symbol can be indexed by its bit line (BL) and word line (WL) numbers, provided that the dimension of the symbol is two. The level of indexing is related to the types of the constraints for the input data. Thus, if there is a correlation between blocks, a cell may also be indexed with its block number (along with its WL and BL numbers), and the dimensionality of the problem will be 3. For certain useful algorithms, the elementary data units are bits, where each bit may be indexed by its WL, BL and page numbers.

Alternatively, if the dimensionality is 3, it may be simpler to number the pages in a block according to some established order, and then a bit may be indicated by only its page and BL numbers.

Sometimes there are restrictions on the amount and structure of the data that may be processed during read/program operations. For example, in certain NAND flash memories, in order to minimize reading time, a single-page restriction is enforced, where only the page containing the requested information is read. A restriction on programming may emerge from limitations on programming buffer size.

According to certain embodiments of the inventive concept, binary linear codes may be used as constituent codes, where the aforementioned restrictions on programming/reading need to be translated into corresponding coding rules.

An exemplary preliminary step may assume that an independent dimension denotes the dimension over which input data may be encoded the basic codewords without violating program/read restrictions. As an example, when considering certain NAND flash memory, the single page requirement dictates that the independent dimension is along the WL and the elementary data unit is the bit.

Referring to FIG. 1, an encoding approach that may be performed by the encoder 120 in accordance with certain embodiments of the inventive concept includes:

Step One—Partition a data structure into M segments, each segment having a unique number assigned, and each segment containing elementary data units defined by an independent dimension.

Step Two—Define an encoding ordering which may be a permutation on the unique segment numbers (e.g., 1 ... M).

Step Three—Move the segments according to encoding ordering; that is, for an $i^{th}$ segment, locate all positions in the constituent segment where a certain value may cause an inevitable violation of the data constraint, such that a storable set of constraints for the data of the segment is developed.

Step Four—Use a code for stuck cells to store the required information associated with the segment while honoring the set of developed constraints.

Using the foregoing exemplary approach, and especially Steps Three and Four, it should be apparent that any constraint can be met. The open question at this point is really on of, "What price must be paid for being able to do so?" Stated in more useful terms, "What information rate can be achieved?"

Certain embodiments of the inventive concept may be sensitive to the segmentation of Step One (i.e., different segmentations may results in different information rates). Hence, an essential part of planning a code for a certain constraint is to search for the segmentation and ordering of the data structure that maximizes the resulting information rate.

Next, a near-optimal partitioning approach potentially useful in Step One above for certain embodiments of the inventive concept will be described below.

A search for every possible partitioning approach would certainly be prohibitively complex. However, as will be recognized by those skilled in the art upon considering the subject specification, certain simple partitioning approaches may yield acceptable, if not (near-)optimal results.

Figures 19, 20:
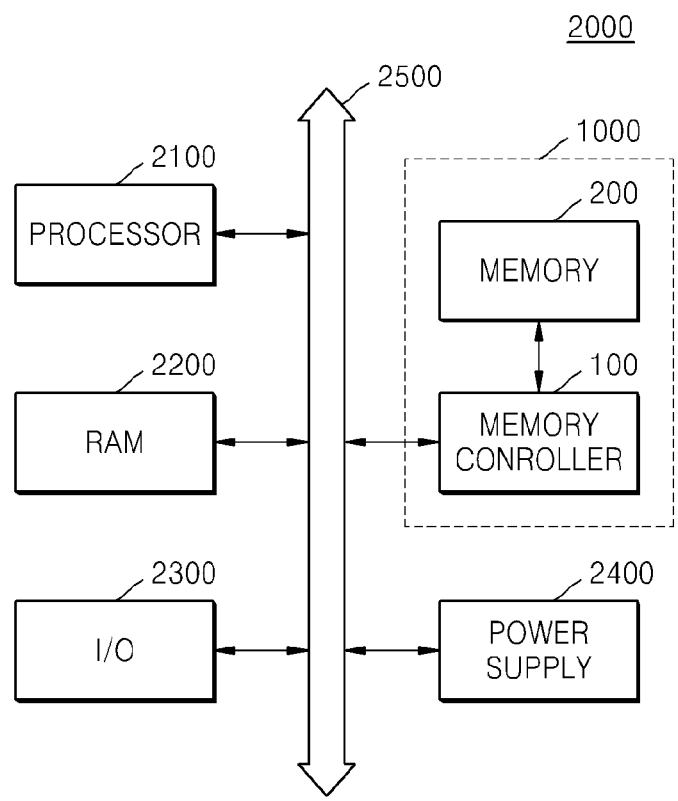
FIG. 19 is a data table illustrating an example of a forbidden data pattern that is formed by neighboring memory cells proximate a memory cell having an erased state.
FIG. 20 is a block diagram illustrating an electronic system that may be configured to incorporate one or more embodiments of the inventive concept.

Referring to FIGS. 17 and 18, a prohibitive data pattern P3-E-P3 induces a span of 6 bits or 3 symbols. Referring to FIG. 19, a 2D pattern where no more than a single P3 is allowed around an erased cell induces a span of 18 bits or 9 symbols.

A set G of the predicted constraint span includes length-n vectors representing locations of the cells affected by the single constraint. Vectors of the set G are expressed by vi (here, i=1, ... k, k= ... G).

Then, the span projected on the $j^{th}$ dimension is defined by equation 1 below.

$$Sp_j = \max_i \ [v_i]_j - \min_i \ [v_i]_j, \qquad (1)$$

where $[v_i]_j$ the $j^{th}$ element in the vector $v_i$.

In these illustrative contexts, exemplary partitioning approaches may be easily understood, where 's' denotes a span of a constraint projected onto an independent dimension. Then, the independent dimension may be partitioned into 's' equal segments. Accordingly, the $i^{th}$ segment will be composed of the elementary data units in positions i, i+s, i+2s, . . . .

For example, the projection of vertical P3-E-P3 constraint on the WL axis has span 1, hence the entire page may be encoded at once. After segmentation, the order of the encoding may be found using a search and invoking symmetry properties. The encoding algorithm proceeds on a page-by-page basis, and the i-th page is the collection of 'n' bits formed by taking the i-th bit of each memory cell.

As above, the elementary data unit is assumed to be the bit. Hence a page may be partitioned into 'm' equal codewords, where the bits in each codeword are separated by 'm' memory cells. This is one example of many different approaches to equivalent ordering. According to one ordering, start with page 0 of WL 0, and apply code for stuck bits for all the segments in it one after another, while the fixed values of the past coded bits serve as an indication for determining the stuck bits for the current codeword.

After coding page 0, moving to page 1 and perform the same operation, and so on until the entire block is written. In general, when examining the i-th segment, there are (i/m) programmed pages, and for each bit in the i-th segments, each undecided bit is now in one of two states: (1) the bit may be unconstrained (i.e., writing either 1 or 0 in it does not create any undesirable symbol pattern, or (2) the bit may be forced to be either 1 or 0 in order not to create a forbidden data pattern.

According to certain embodiments of the inventive concept, a code related to the stuck bits having the following constraints may be applied.

For some constraints, the above partitioning is too fine, and a coarser, equivalent, partitioning should be used. This is because for many code blocks no constraints emerges at all, hence all those code blocks may be united to a single, un-coded block.

It is assumed that there are 'n' MLC flash memory cells (i.e., the number of possible threshold voltage distributions is 4 in order to store 2 bits per MLC). The four distinct states for each MLC may be are denoted E, P1, P2, and P3, and are mapped to bits in the following way: E→00, P1→01, P2→11, P3→10, per FIG. 8. The first page corresponds to the left (MSB) bit, while the second page corresponds to the right (LSB) bit.

One approach to reducing the number of forbidden data pattern occurrences is centered on the stored data value pattern P3-E-P3.

That is, the number of forbidden data pattern occurrences including P3-E-P3 in three adjacent cells presents a case following the foregoing definitional convention where M=3. Assuming that the above described method is used, and for the 5 first segments (the 3 segments of page 0 and 2 segments of page 1) in which data corresponding to the forbidden data patterns may exist, the following operations may be performed:

As a first stage in the coding scheme, the word line (WL) is partitioned into two groups. The first group includes memory cells whose indices are in a set U, and the second group includes complementary cells.

The set U is defined by U={1≤i≤N:3|i}, i.e., all the integers between 1 and N which are divisible by 3. The complementary set is denoted by V. The information vector (in symbols) is denoted by D. The symbols are composed of 2 information bit streams, denoted by D1 and D2. The encoded symbols vector is denoted by C, and its constituent pages are denoted by C1 and C2.

Encoding may be performed as follows:
1. C[V]=D[V] That is, the original information 'as is' in the positions of the set V is written.
2. Partition the set U into two equal or almost equal sets—any partitioning approach may be used so long as both the transmitter and receiver are synchronized—the results may be denoted U1 and U2.
3. Set C1 [U1]=D1 [U1], C2 [U2]=D2 [U2]. That is, the bits corresponding to the first page in the positions of the set U1 are written freely. Likewise, the bits corresponding to the second page in the positions of the set U2 are written freely.
4. For all i∈U1 inspect u=(D[i−1],D1[i],D[i+1]). If u=[P3, 1,P3], then bit D2[i] should be stuck at 0.
5. For all i∈U1 inspect u=(D[i−2],D[i−1],D1[i]). If u=[P3, E,0], then bit D2[i] should be stuck at 0.
6. For all i∈U1 inspect u=(D1[i],D[i+1],D[i+2]). If u=[0, E,P3], then bit D2[i] should be stuck at 0.
7. For all i∈U2 inspect u=(D[i−1],D2[i],D[i+1]). If u=[P3, 1,P3], then bit D1[i] should be stuck at 0.
8. For all i∈U2 inspect u=(D[i−2],D[i−1],D2[i]). If u=[P3, E,1], then bit D1[i] should be stuck at 1.
9. For all i∈U2 inspect u=(D2M,D[i+1],D[i+2]). If u=[1, E,P3], then bit D1[i] should be stuck at 1.
10. Using code for stuck bits, the information sequence D2[U1] is encoded according to the stuck bits information obtained in steps 4-6. The required overhead has to be kept in the LSB of additional 's' memory cells, where 's' is chosen according to the achievable rate of the code and the number of stuck bits.
11. Using code for stuck bits, the information sequence D1[U2] is encoded according to the stuck bits information obtained in steps 7-9. The required overhead has to be kept in the MSB of additional 's' memory cells, where 's' is chosen according to the achievable rate of the code and the number of stuck-at bits.

Continuing with the foregoing assumptions, the probability for a bit at position i∈U to be stuck is upper-bounded by 3/32. The partitioning technique introduced in step 2 enables a balance between the overhead of the two pages, so the overhead in cells for large enough WL close to is 3|U1|·ρ/32=3|U|·ρ/64, where ρ denotes the gap to capacity of the code used.

Denoting the length of a WL by N, the asymptotic rate is $(1-\rho/64)$. As explained above, there are codes with reasonable encoding complexity which may operate very close to the capacity (ρ being approximately 1). For such codes the asymptotic rate of the suggested method is 0.9844 bits/page. Using the simple regular code, ρ being 1.21, and the rate is 0.9811 bits/page.

Since the coding is done on a page by page basis, decoding may be performed using a single page reading which is an important feature in certain embodiments of the inventive concept.

Next, an approach for reducing the number of undesired data pattern occurrence of P3-E-P3 in a vertical pattern according to another embodiment of the present inventive concept will be described below.

The setup is as before. It is assumed that the vertical pattern is of span m. First, the span of the projection of the constraint on the WL dimension (the independent dimension) is observed. Obviously it is 1 (vertical constraint), hence the partitioning of the block is simply to pages, i.e., each codeword is a complete page. When encoding page i, (i/b) WLs from below are fixed (already coded) as well as the first mod(i,b) pages from the current WL. Now for each bit, m−1 WLs from below is observed and it is determined whether or not to stick a bit based on the observation.

For example, the case of vertical P3-E-P3 pattern will be described below. The notations are as in the example of horizontal pattern. Here, U denotes the set of all integers between 1 and N (N is the WL length). WL number is indicated by a subscript, e.g., $C_3[7]$ is the seventh coded symbol at WL number 3, and $D1_5[2]$ is the second bit in the information MSB page of WL 5. It is assumed that there are L WLs in a block.

An exemplary encoding operation that may be performed by encoder 120 of FIG. 1 includes:
1. Set $C_1=D_1$, $C_2=D_2$. That is, write WLs 1 and 2 freely. For WLs 3 and on do the following.
2. Partition the set U into two equal or almost equal sets. Any partitioning may be chosen as long as both the transmitter and receiver are synchronized. Denote the resulted sets by U1 and U2.
3. Set C1[U1]=D1[U1], C2[U2]=D2[U2]. That is, the bits corresponding to the first page in the positions of the set U1 are written freely. Likewise, the bits corresponding to the second page in the positions of the set U2 are written freely.
4. At WL j, inspect $u=(C_{j-2}[i], C_{j-1}[i], D1_j[i])$ for all i∈U1. If u=(P3,E,0), then bit $D2_j[i]$ has to be stuck at 0.
5. At WL j, inspect $u=(C_{j-2}[i], C_{j-1}[i], D2_j[i])$ for all i∈U2. If u=(P3,E,1), then bit $D1_j[i]$ has to be stuck at 1.
6. Using code for stuck bits, encode the information sequence $D2_j[U1]$ according to the stuck bits information obtained in step 4. The required overhead has to be kept in the LSB of additional 's' memory cells, where 's' may be chosen according to the achievable rate of the code and the number of stuck-at bits.
7. Using code for stuck bits, encode the information sequence $D1_j[U2]$ according to the stuck bits information obtained in steps 5. The required overhead has to be kept in the MSB of additional 's' memory cells, wherein 's' may be chosen according to the achievable rate of the code and the number of stuck-at bits.

According to the foregoing coding method, the information regarding the 2 last WL is available to the encoder 120 of the memory controller 100 by writing it in the RAM 140 or reading the memory device 200. However, there is no need to know information about other pages other than the page to be decoded by the decoder 130. Like in the above described method, (1−ρ/64) rate may be achieved. That is, exactly the same rate as for horizontal P3EP3 avoidance code may be achieved.

Next, a 2D pattern avoiding algorithm according to another embodiment of the present inventive concept will be described below.

Both vertical and horizontal patterns are one dimensional (1D) problems. However, it is not desired to separate the original problem of coupling-induced widening of the erase state distribution into two 1D problems. This is because the coupling effects are accumulative (i.e., both horizontal and vertical coupling add to the widening of the distribution), and though the vertical coupling coefficient is larger than the horizontal coupling coefficient, the latter is not negligible by any means. Therefore, a more complete treatment of hazardous data patterns must be considered for any detrimental 2D pattern as 1D patterns will probably come short of providing satisfying results.

The coding for stuck bits along with a sophisticated partitioning of the information block allows the task to be completed. The rate to the capacity may not be compared since the capacity for the 2D case is not known, but using some heuristic considerations it appears that the achieved rate is very good.

As an example, the case where no more than one P3 may be programmed adjacent to (or around) an erased state is considered. The span of this constraint is 9 symbols, and the span of the projected constraint on the WL (or page) dimension is 3 symbols (bits). Following the guidelines above, we partition each page to 3 codewords as in the horizontal case. Here again, the first page in a WL may be written freely, as the forbidden symbols may be either P3 or E, which may be eliminated solely based on the second page. When programming the $i^{th}$ codeword (i=0, 1, 2) of the second page, 2 WLs from below are fixed as well as i symbols to the left, while 2-I symbols to the right are yet undetermined. Based on that the decoder decides on each bit whether to stick it or not, as follows:

For codeword 0, if the symbol below is at erased state and it has one P3 neighbor, and if the bit of page 0 is 1—stick the bit of page 1 at 1, else set it free.

For codeword 1, if the symbol below is at erased state and it has one P3 neighbor, and if the bit of page 1 is 0—stick the bit of page 2 at 0. Else, if the symbol below is P3 and the symbol to the left is also P3, and if the bit of page 1 is 1—stick the bit of page 2 at 0. Else, set it free.

For codeword 2, if the symbol below is at erased state and it has one P3 neighbor, and if the bit of page 1 is 0—stick the bit of page 2 at 0. If at least two of its neighbors are in P3 and if the bit of page 1 is 0—stick the bit of page 2 at 0. Else, set it free.

From the above it is clear that not all the pages have the same rate. In reality however, all the cells in the WL have the same behavior and no a-priori known "free" cells group exist. Another restriction that makes the above assumption impractical is that it is required to obtain the information bits of a single page with no need to read any other page. Clearly, storing all the overhead bits of all the pages mixed together on the k pages contradicts this requirement.

In light of the above, one understand that for practical reason, all the coded bits of a page have to be stored in that page itself. Since the number of cells in a WL has to support the worst page, the rate of the entire layered coding system is the rate of the worst page.

$R_i$ denotes the rate of the binary code of the $i^{th}$ page, the overall rate in terms of bits per cell is expressed by equation 2.

$$R = k \min_i (R_i) \quad (2)$$

In order to maximize the rate, all of the pages will have the same rate. According to certain embodiments of the inventive concept, a balancing approach which achieves a goal asymptotically as the page length tends to infinity is suggested.

During initialization, a segmentation of the data structure is applied, the number of segments in a page being denoted by 'm'.

An exemplary approach includes:

Step 1: Choose a set of c permutations on $\{0, \ldots, b-1\}$, c Each permutation defines an encoding ordering of pages inside a WL.

Step 2: For each segment, all c permutations are applied on page ordering and for each permutation, a probability vector of size b is obtained, where $i^{th}$ element thereof denotes the fraction of stuck bits in page i, i=0, ..., b-1. This step results in a set of cm probability vectors, denoted by $p_j$, j=0, ... cm-1

Step 3: Create a matrix A from the vector columns $p_j$. The order of the vectors in A has to be according to the order of segments, i.e., the leftmost c columns belong to permutations of the first segment. The size of the matrix A is "bxcm".

Step 4: Make a further partitioning of each segment into c sub-segments. The relative number of cells which belongs to the $j^{th}$ sub-segment of the $i^{th}$ segment is denoted by $\alpha_{ij}$. The second partitioning may be done in any predetermined way which is known to both the encoder and decoder. In the $j^{th}$ sub-segment the order of encoding is dictated by the $j^{th}$ permutation defines in Step 1. Define $(\alpha \equiv (\alpha_{0,0}, \alpha_{0,1}, \ldots, \alpha_{0,c-1}, \alpha_{1,0}, \ldots, \alpha_{m-1,c-1})$. The vector $\phi = A\alpha$ depicts the expected ratio of stuck bits in the different pages.

Step 5: In order to achieve the highest information rate, all the entries in $\phi$ have to be equal, i.e., a complete balancing of the overhead bits. The linear equation system may be represented the $A\alpha=d$ where d is any vector of equal positive entries yields a solution which can be normalized so as the sum of its entries equal 1.

However, there are other constraints on a rather than its sum. The prime partitioning above must keep its structure. For example, following the guidelines section "near-optimal partitioning" all segments have to be equal in size.

The minimal sum of element of all the vectors in P is denoted by μ, i.e., $$\mu = \min_{0 \leq i < cm} \sum_{j=0}^{b-1} [p_i]_j.$$

Now, it is assumed that there exists a subset of P (denoted by $\tilde{P}$) of cardinality greater than b which satisfies that the sum of elements in any vector in it is μ. The constraints on the sizes of the segments are also linear, and may be put in the linear equations system like equation 4.

$$\tilde{A}\alpha = g \quad (4)$$

where the first b elements in g are $$\frac{\mu}{b}$$

and the last m elements are 1/m.

The above system is under-determined (more unknowns than equations). If no solution exists, increase c and go back to Step 1. If the system is full column rank, choose a solution vector $\alpha_0$ which all its entries are non-negative and normalize it by multiply it by the inverse of the sum of its entries.

Accordingly,

Step 6: Partition the m segments according to the probabilities in $\alpha_0$ according to Step 4.

Step 7: Encode the data according to the partitioning and ordering dictated by the previous steps using algorithm.

It should be mentioned that the above algorithm only demonstrates a concept of balancing and many other variants of it may be easily devised by anyone with ordinary skill of the art. For example, one may chose different sets of permutations for the different segments.

The essence of the method is to partition any segment into several sub-segments in such a way that the number of stuck bits is equal for all the pages. The balancing algorithm above suggests one way to solve this problem for some cases.

The essence of a code for stuck bits is that it can deliver information over a memory device 200 with constraints (stuck bits) where only the encoder is aware of the constraints, in such a way that the decoder 130 may retrieve the information without any knowledge of the constraint.

The motivation not to honor all constraint is that, as clear from the previous sections, the larger the number of stuck bits is, the lower the information rate is. Hence, whenever the encoder 120 faces a bit which has to be stuck at some value in order to honor a constraint, it can decide if it is worthwhile to stuck it or not. This can be done with the aid of side information regarding the physical factors which underlie the constraint.

For example, in NAND flash memory, the physical reason to avoid P3-E-P3 is that the coupling cause by the neighbors of the erased cell may increase its threshold voltage to a level which will cause an error.

Clearly, if the erased voltage before programming the neighbors is very low, the probability than an error will occur (even if its neighbors are in P3); if, on the other hand, the threshold voltage of an erase cell is high, than the probability that an error will occur is also very high It is assumed that the probability for error is $P_e$. Also it is assumed that the system uses an ECC which require x bits to correct an error, and that our code for stuck bits requires $\rho$ bits to cope with a single stuck. Than we gain (on the average) from sticking the bit if $xp_e > \rho$. In such a way we may eliminate only the occurrences of patterns which will really harm us (in terms of BER, for example), thus increasing the overall rate. The information on the value of the erased voltage may be obtained using some read operations before programming.

Figure 11:
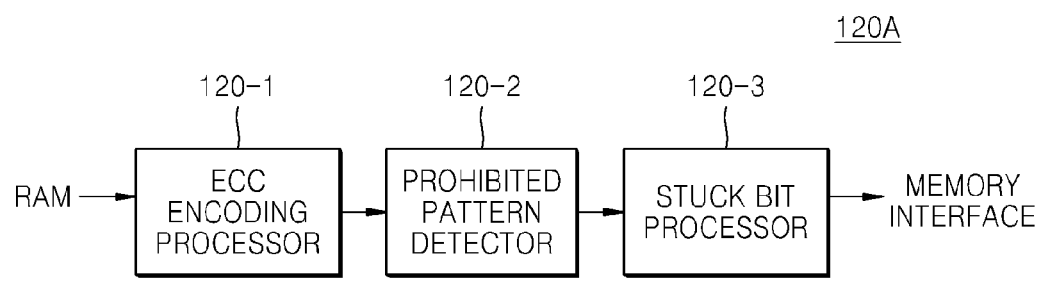
FIG. 11 is a diagram illustrating one approach to encoder operation according to an embodiment of the inventive concept.

FIG. 11 is a block diagram illustrating one approach to the operation of the encoder 120 of FIG. 1. Here, the encoder 120A is assumed to include an error correction code (ECC) encoding processor 120-1, a forbidden pattern detector 120-2, and a stuck bit processor 120-3.

The ECC encoding processor 120-1 generates parity bits about information words received by using an algorithm such as Reed-Solomon (RS) code, a Hamming code, and a Cyclic Redundancy Code (CRC) code, and generates codewords by attaching the generated parity bits to the information words. Using the same ECC algorithm, an error correction ability per unit data size is increased in proportion to the ECC size. As an example, if the ECC size of 112 bytes per 4K byte page in the ECC algorithm processing bit error of 1024 bytes data to 16 bits or less, an ECC size of 224 bytes per 4K byte page is necessary in an ECC algorithm processing the bit error of 1024 byte data to 32 bits or less.

The forbidden pattern detector 120-2 detects a set of symbols that may generate forbidden patterns that are set initially from the codewords generated by the ECC encoding processor 120-1. That is, after partitioning the codewords described above into span of the initially set constraints, the set of symbols that may generate forbidden patterns is detected from the pattern of the codewords included in the partitioned constraints. As an example, the set of symbols that may generate forbidden patterns may be detected from horizontal, vertical, or 2D region of the memory cell array.

The stuck bit processor 120-3 sticks at least one bit included in the set of the symbols that may generate the forbidden patterns so as to convert the set into a set of symbols that may not generate forbidden patterns. In addition, the set of the symbols that may not generate the forbidden pattern is not stuck. That is, bits included in the set of the symbols that may not generate the forbidden pattern are output as they are without being converted. This is described in the above algorithm of reducing the number of occurrences of the undesired patterns in the horizontal pattern, the algorithm of reducing the number of occurrences of the undesired patterns in the vertical pattern, and the 2D pattern avoiding algorithm, and thus, detailed descriptions thereof are not provided here. For example, the stuck bit processor 120-3 may generate information necessary for recovering the stuck bit and may add the generated information to the encoding information, as well as performing the stuck bit process described above.

The data output from the stuck bit processor 120-3 is transferred to the memory device 200 via the memory interface 160, and is programmed in a physical page that is converted in the flash transform layer 103.

Figure 12:
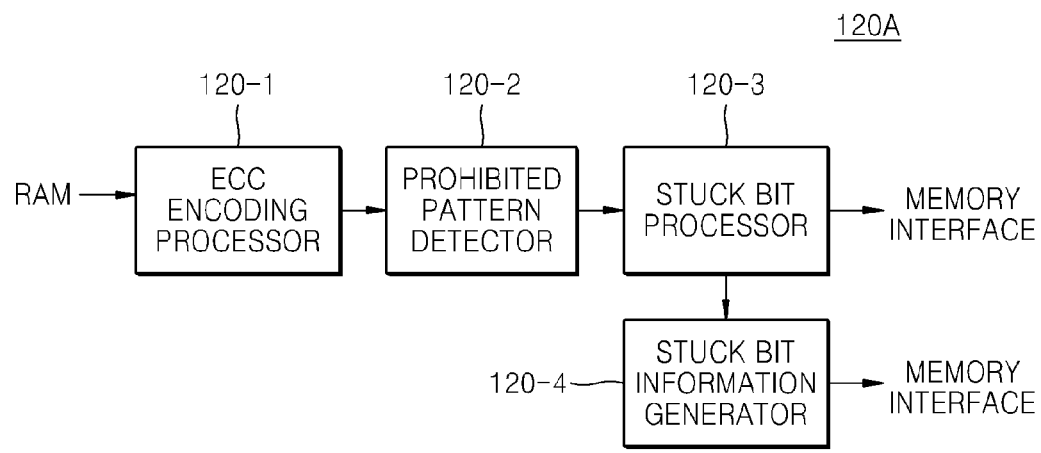
FIG. 12 is a diagram illustrating another approach to encoder operation according to an embodiment of the inventive concept.

FIG. 12 is a block diagram illustrating another approach to the operation of the encoder 120 of in FIG. 1.

As shown in FIG. 12, an encoder 120B includes an ECC encoding processor 120-1, the forbidden pattern detector 120-2, the stuck bit processor 120-3, and a stuck bit information generator 120-4.

The ECC encoding processor 120-1, the forbidden pattern detector 120-2, and the stuck bit processor 120-3 shown in FIG. 12 are described already with reference to FIG. 11, and thus, detailed descriptions are omitted.

The encoder 120B shown in FIG. 12 additionally includes the stuck bit information generator 120-4, when comparing with the encoder 120A shown in FIG. 11. The stuck bit information generator 120-4 generates location information of the stuck bit so as not to generate the forbidden pattern.

The data output from the stuck bit processor 120-3 and location information of the stuck bit are transferred to the memory device 200 via the memory interface 160, and are programmed in a physical page that is transformed by the flash transform layer 103. As an example, location information of the stuck bit may be programmed in an overhead storage region of the corresponding page.

In FIG. 12, the stuck bit information generator 120-4 generates location information of the stuck bit. However, as another example, the stuck bit processor 120-3 may perform generation of location information about the stuck bit, in addition to the stuck bit process described with reference to FIG. 11.

Figure 13:
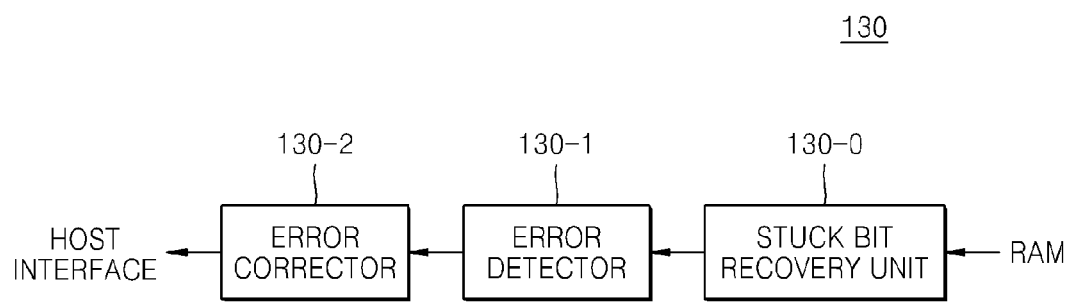
FIG. 13 is a diagram illustrating an approach to decoder operation according to an embodiment of the inventive concept.

FIG. 13 is a block diagram illustrating one approach to the operation of decoder 130 of FIG. 1. The decoder 130 comprises a stuck bit recovery unit 130-0, the error detector 130-1, and the error corrector 130-2.

The stuck bit recovery unit 130-0 recovers the bit value at the stuck bit included in the data read from the memory device 200 by using the location information of the stuck bit read from the memory device 200 into the value before the stuck bit process.

The error detector 130-1 detects an error bit of the data that is recovered from the stuck bit by using the ECC algorithm. That is, the error bit about the data recovered from the stuck bit is detected by using the parity bits attached to the read data.

The error corrector 130-2 corrects a bit value of the error bit detected by the error detector 130-1.

Next, a coding method and a decoding method executed by the memory controller 100 in the memory system 1000A or 1000B shown in FIG. 1 or FIG. 2 will be described below by using the above described algorithms.

Figure 14:
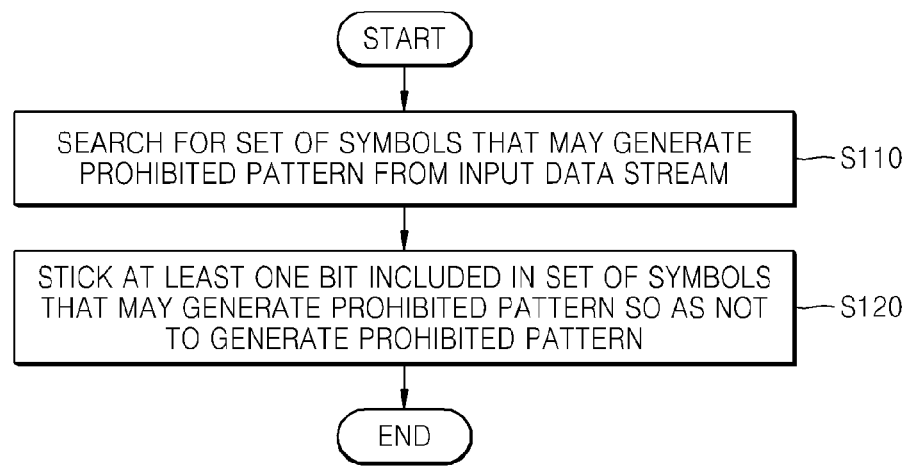
FIG. 14 is a flowchart illustrating a coding method that may be used in a memory system according to an embodiment of the present inventive concept.

FIG. 14 is a flowchart illustrating a coding method for use in a memory system according to embodiments of the inventive concept.

The memory controller 110 searches for a set of symbols that may generate a forbidden pattern of initially set constraints from unconstrained input data to be stored in the memory device 200 (S110). For example, the forbidden pattern may include a set of symbols of undesired programmed state(s) at left and right adjacent locations or up and down adjacent location of a symbol in the erased state in the memory device 200 of the MLC. As described above, the set of symbols that may generate the forbidden pattern may be searched for in the horizontal direction, the vertical direction, or the 2D area of the memory cell array.

Next, the memory controller 100 sticks at least one bit included in the set of the symbols that may generate forbidden pattern so as not to generate the forbidden pattern (S120). For example, the memory controller 100 partitions the cells of the memory device 200 included in one cell into at least two groups. In one of the at least two partitioned groups, one bit included in the set of the symbols that may generate forbidden pattern in an upper page (MSB) of the corresponding WL is stuck, and in the other group, one bit included in the set of the symbols that may generate the forbidden pattern in a lower page (LSB) of the corresponding WL is stuck. For example, the memory controller 100 may restricts the number of bits that are stuck to an initially set value per page unit. As an example, the memory controller 100 may classify the bit lines in the memory cell array of the memory device 200 into unit groups of three successive bit lines, and may selectively stick a bit corresponding to one of the three bit lines included in each unit group. In addition, the memory controller 100 may generate location information about the stuck bit, and may control the memory system so that the location information about the stuck bit in an overhead storage region of the memory device 200.

Figure 15:
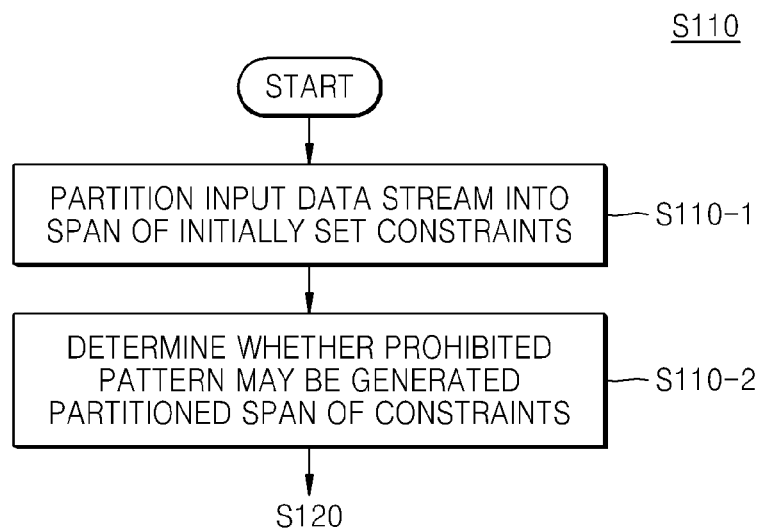
FIG. 15 is a flowchart illustrating a process of searching for a set of symbols that may generate a forbidden pattern.

FIG. 15 is a flowchart further illustrating the step of detecting the location of a forbidden pattern (S110) as performed in the method of FIG. 14.

In operation S110-1, the memory controller 100 partitions the input data stream into the initially set constraint span. For example, if the span of the initially set constraints is three symbols, the input data stream is partitioned into units, each including three symbols. In addition, the input data stream may be partitioned into the units of three symbols while shifting the symbols one by one.

In operation S110-2, the memory controller 100 determines whether the forbidden pattern may occur from the pattern of the input data included in the span of the constraints. For example, it may be determined whether the forbidden pattern may occur with respect to five segments among six segments configuring the three symbols included in the span of the constraints. For example, the cells included in one WL are partitioned into at least two groups, and it may be determined whether the forbidden pattern may occur with respect to a set of three segments in the MSB page and two segments in the LSB page of the corresponding WL, in one group between the at least two partitioned groups. In addition, in another group, it may be determined whether the forbidden pattern may occur with respect to a set of two segments in the MSB page and three segments in the LSB page of the corresponding WL.

Figure 16:
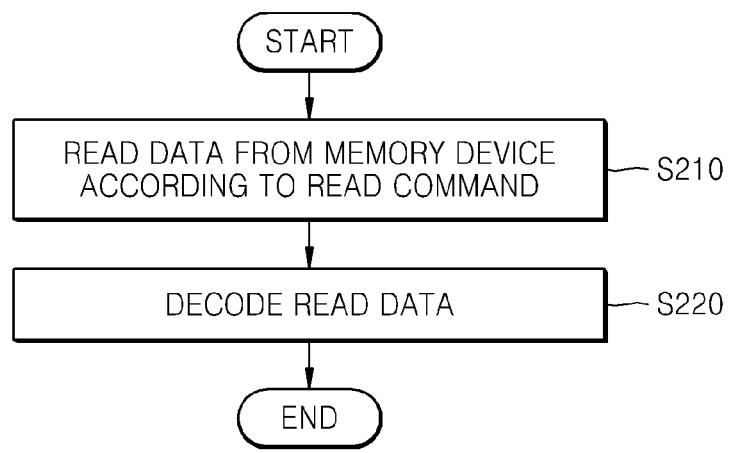
FIG. 16 is a flowchart illustrating a decoding method for a memory system according to an embodiment of the inventive concept.

FIG. 16 is a flowchart illustrating a decoding method for a memory system according to an embodiment of the inventive concept.

The memory controller 100 reads data from the memory device 200 according to a read command (S210). Next, the memory controller 100 decodes the data read from the memory device 200 (S220).

For example, the data read from the memory device 200 is recovered to the value before the stuck bit process by using the information that is necessary for recovering the stuck bit, and then, the error detection and the error correction processes may be performed.

For example, in a case where the location information about the stuck bit is stored in the memory device 200, the memory controller 100 recovers the bit value of the stuck bit included in the data read from the memory data 200 to a value before the stuck bit process by using the location information about the stuck bit. After that, the memory controller 100 performs an error detection process and an error correction process by using parity bits according to the ECC algorithm.

FIG. 20 is a block diagram of an electronic apparatus that may be configured to incorporate a memory system according to embodiments of the present inventive concept.

Referring to FIG. 20, an electronic apparatus 2000 includes a processor 210, a read-only-memory (RAM) 2200, an input/output device 2300, a power supply device 2400, and a memory system 1000. Although not shown in FIG. 20, the electronic apparatus 2000 may further include ports that may communicate with video cards, sound cards, or universal serial bus (USB) devices, or other electronic devices. The electronic device 2000 may be realized as a personal computer, or a portable electronic device such as a notebook computer, a mobile phone, a personal digital assistant (PDA), and a camera.

The memory system 1000 shown in FIG. 20 may be the memory system 1000A or 1000B shown in FIG. 1 or FIG. 2 according to the embodiment of the present inventive concept. Thus, the memory controller 100 may perform the coding operation and the decoding operation so as to avoid the forbidden pattern by applying the coding and decoding methods suggested by the present inventive concept.

The processor 2100 may perform certain calculations or tasks. Accordingly, the processor 2100 may be a microprocessor or a central processing unit (CPU). The processor 2100 may communicate with the RAM 2200, the input/output device 2300, and the memory system 1000 via a bus 2500 such as an address bus, a control bus, and a data bus. In some embodiments of the present inventive concept, the processor 2100 may be connected to an expanded bus such as peripheral component interconnect (PCI) bus.

The RAM 2200 may store data that is necessary to operate the electronic apparatus 2000. For example, the RAM 2200 may be a dynamic RAM (DRAM), a mobile DRAM, an SRAM, a PRAM, an FRAM, an RRAM, and/or an MRAM.

The input/output device 2300 may include an input unit such as a keyboard, a keypad, or a mouse, and an output unit such as a printer or a display. The power supply device 2400 may supply an operating voltage to operate the electronic apparatus 2000.

Figure 21:
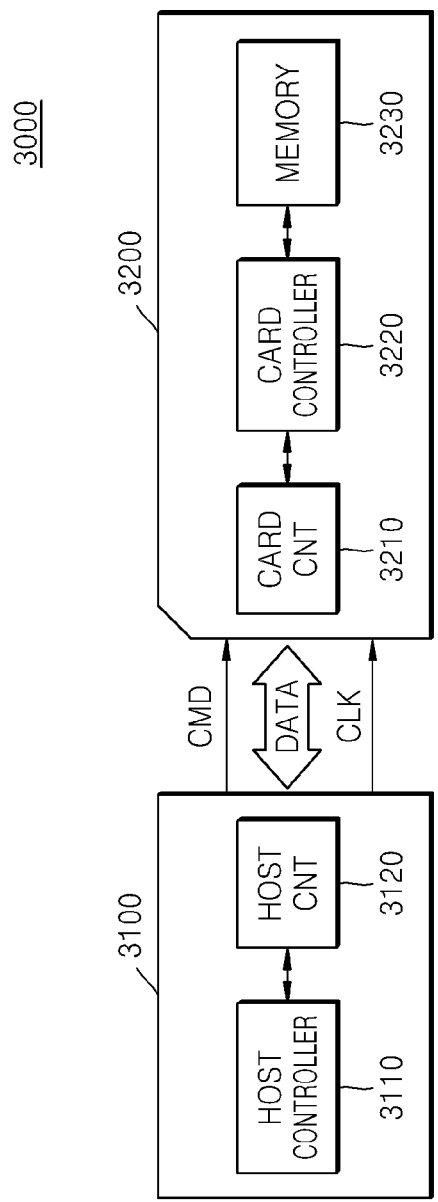
FIG. 21 is a block diagram illustrating a memory card system that may be configured to incorporate one or more embodiments of the inventive concept.

FIG. 21 is a block diagram of a memory card system including a memory system 3000 according to embodiments of the present inventive concept.

Referring to FIG. 21, the memory card system 3000 may include a host 3100 and a memory card 3200. The host 3100 includes a host controller 3110, and a host connecting unit 3120. The memory card 3200 may include a card connecting unit 3210, a card controller 3220, and a memory device 3230.

The card controller 3220 and the memory device 3230 shown in FIG. 21 may be the memory controller 100 and the memory device 200 or 200' shown in FIG. 1 or FIG. 2.

The host 3100 may write data to the memory card 3200, or may read data stored in the memory card 3200. The host controller 3110 may transmit commands CMD, clock signals CLK generated in a clock generator (not shown), and data DATA to the memory card 3200 via the host connecting unit 3120.

The card controller 3220 may perform a coding operation and a decoding operation so as to avoid the forbidden pattern in response to the command received via the card connecting unit 3210, by using the coding method and the decoding method according to the present inventive concept.

The memory card 3200 may be a compact flash card (CFC), a microdrive, a smart media card (SMC), a multimedia card (MMC), a security digital card (SDC), a memory stick, or a US flash memory driver.

Figure 22:
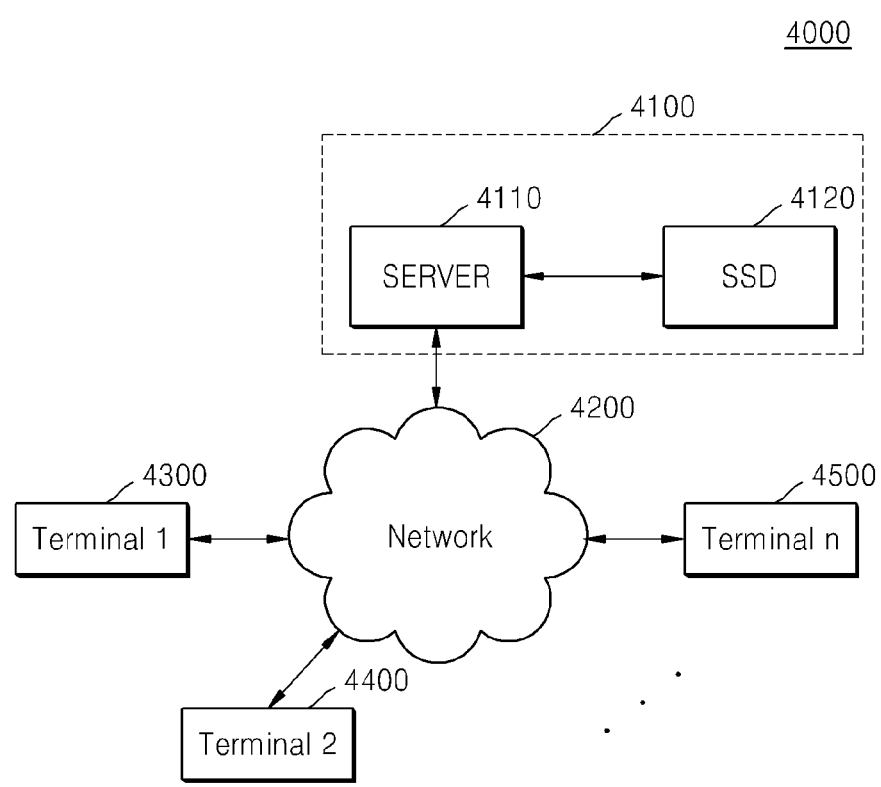
FIG. 22 is a block diagram illustrating a network server system that may include one or more solid state drives (SSD) according to certain the embodiments of the inventive concept.

FIG. 22 is a block diagram illustrating a network server system 4100 including an SSD according to the embodiments of the present inventive concept.

Referring to FIG. 22, the network system 4000 according to the embodiment of the present inventive concept may include a server system 4100, and a plurality of terminals 4300, 4400, and 4500 connected to each other via a network 4200. The server system 4100 of the present embodiment may include a server 4110 processing requests transmitted from the plurality of terminals 4300, 4400, and 4500 connected to the network 4200, and an SSD 4120 storing data corresponding to the requests transmitted from the terminals 4300, 4400, and 4500. Here, the SSD 4120 may be the memory system 1000A or 1000B shown in FIG. 1 or FIG. 2.

Meanwhile, the memory system according to the present inventive concept may be mounted by using various types of packages. For example, the memory system according to the embodiments of the present inventive concept may be mounted by using packages such as a package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric-quad flat pack (MQFP), thin quad flat-pack (TQFP), small outline (SOIC), shrink small outline package (SSOP), thin small outline (TSOP), thin quad flat-pack (TQFP), system in package (SIP), multi chip package (MCP), wafer-level fabricated package (WFP), and wafer-level processed stack package (WSP).

While the inventive concept has been particularly shown and described with reference to exemplary embodiments thereof, it will be understood that various changes in form and details may be made therein without departing from the scope of the following claims.

What is claimed is:

1. A coding method for a memory system including a memory cell array, the method comprising:
searching for a set of symbols that generate a forbidden data pattern in input data received by the memory system by partitioning the input data into spans of initially set constraints, and determining whether the forbidden data pattern is generated from patterns of the input data included in the partitioned spans; and
sticking at least one bit in the searched set of the symbols to avoid generation of the forbidden data pattern.

2. The method of claim 1, wherein the searching of the set of the symbols comprises at least one of searching for the set of symbols in a horizontal direction of the memory cell array, and searching for the set of symbols in a vertical direction of the memory cell array.

3. The method of claim 2, wherein searching for the set of symbols in the horizontal direction searches for symbols in the input data to be stored along a word line.

4. The method of claim 2, wherein searching for the set of symbols in the vertical direction searches for symbols in the input data to be stored along a bit line.

5. The method of claim 1, wherein the forbidden data pattern is searched for according to a unit of at least three neighboring symbols.

6. The method of claim 1, wherein the sticking of at least one bit in the searched set of the symbols to avoid generation of the forbidden data pattern comprises:
partitioning an arrangement of memory cells along a word line into two groups; and
in one of the two partitioned memory cell groups, sticking a first bit in an upper page associated with the word line, and in the other memory cell group, sticking a second bit in a lower page associated with the word line.

7. The method of claim 1, wherein the sticking of the at least one bit in the searched set of symbols comprises restricting a number of the at least one stuck bits to a number initially set according to a page unit of the memory device.

8. The method of claim 1, further comprising:
generating stuck bit location information related to the at least one stuck bit; and
storing the stuck bit location information in an overhead storage region of the memory device.

9. The method of claim 1, wherein the searching of the set of symbols that generates the forbidden data pattern comprises:
searching for a set of symbols in programmed states having voltage levels that are equal to or higher than an initially set threshold voltage level, wherein a number of the symbols exceeds a critical value among the memory cells neighboring a memory cell having an erased state E in the memory device of a multi-level cell.

10. The method of claim 1, wherein the sticking of the at least one bit comprises:
classifying bits lines of the memory cell array into unit groups, each bit line group comprising at least three successive bit lines; and
selectively sticking a bit corresponding to one bit line among the three successive bit lines.

11. A coding method for a memory system comprising a memory cell array including at least one multi-level memory cell (MLC), the method comprising:
searching for a set of symbols that generate a forbidden data pattern in input data received by the memory system; and
sticking at least one bit in the searched set of the symbols to avoid generation of the forbidden data pattern,
wherein the forbidden data pattern is a pattern in which at least one symbol corresponding to at least one undesired programmed state is located to either left or right adjacent sides of the MLC in the memory cell array, or to either up or down adjacent sides of the MLC in the memory cell array.

12. The method of claim 11, wherein the at least one symbol corresponds to a programmed state having a level that is equal to or higher than a threshold voltage level initially set by the memory device for the MLC.

13. The method of claim 11, wherein the MLC are configured to store 2-bit data according to an erased state (E), a first program state (P1), a second program state (P2) and a third program state (P3), wherein respective threshold voltage distributions for E, P1, P2 and P3 are successively higher in level, and the forbidden data pattern is a P3-E-P3 pattern for three MLC arranged along a common word line or a common bit line.

14. A decoding method for a memory system including a memory controller and a memory device including a memory cell array including at least one multi-level memory cell (MLC), the method comprising:

obtaining read data previously encoded from input data received by the memory controller and stored in the memory device; and decoding the read data using stuck bit location information identifying a stuck bit included in the read data during the previous encoding of the input data, wherein the stuck bit is included in the read data during the previous encoding of the input data to avoid generation of a forbidden data pattern in the read data, the forbidden data pattern being a pattern in which at least one symbol associated with at least one undesired programmed state is located to either left or right adjacent sides of the MLC in the memory cell array, or to either up or down adjacent sides of the MLC in the memory cell array.

15. The method of claim 14, wherein decoding the read data comprises recovering a bit value of the stuck bit included in the read data using the stuck bit location information.

16. The method of claim 14, wherein decoding the read data comprises performing at least one of an error detection and an error correction on data obtained by recovering the bit value of the stuck bit.

17. The method of claim 14, wherein the at least one symbol corresponds to a programmed state having a level that is equal to or higher than a threshold voltage level initially set by the memory device for the MLC.

18. The method of claim 14, wherein the MLC are configured to store 2-bit data according to an erased state (E), a first program state (P1), a second program state (P2) and a third program state (P3), wherein respective threshold voltage distributions for E, P1, P2 and P3 are successively higher in level, and the forbidden data pattern is a P3-E-P3 pattern for three MLC arranged along a common word line or a common bit line.

* * * * *